United States Patent
Boudewijns

[11] Patent Number: 6,104,256
[45] Date of Patent: Aug. 15, 2000

[54] DEVICE WITH AN OSCILLATOR CIRCUIT

[75] Inventor: Arnoldus J. J. Boudewijns, Eindhoven, Netherlands

[73] Assignee: U.S. Philips Corporation, New York, N.Y.

[21] Appl. No.: 09/257,636

[22] Filed: Feb. 25, 1999

[30] Foreign Application Priority Data

Mar. 4, 1998 [EP] European Pat. Off. .............. 98200689

[51] Int. Cl.$^7$ .............................. H03B 5/24; H03K 3/027; H03K 3/353
[52] U.S. Cl. .............................. 331/143; 331/34; 331/57; 331/177 R; 331/175; 345/204
[58] Field of Search .................................. 331/34, 57, 74, 331/111, 143, 177 R, 175; 345/204

[56] References Cited

U.S. PATENT DOCUMENTS 6,025,756  2/2000  Miyabe ...................................... 331/57

FOREIGN PATENT DOCUMENTS

WO9426026  11/1994  WIPO .............................. H03K 3/03

*Primary Examiner*—David Mis
*Attorney, Agent, or Firm*—Edward W. Goodman

[57] ABSTRACT

An oscillator circuit contains a switching circuit which periodically charges and discharges a capacitive node. The capacitive node is coupled to the input of the switching circuit via a loop circuit, so that signal transitions at the capacitive node travel through the loop circuit and cause new transitions. The oscillator contains a power supply current source and a mode breaker circuit which function to stabilize the oscillating frequency and to suppress spurious modes of operation, respectively. The mode breaker circuit contains a conduction path which is used to frustrate charging of the capacitive nodes in certain spurious signal configurations. To prevent the mode breaking function from interference between the stabilizing function, the mode breaker circuit is arranged so that it blocks the conduction path during the critical time-intervals when the loop operates in a desired mode.

10 Claims, 5 Drawing Sheets

DEVICE WITH AN OSCILLATOR CIRCUIT

BACKGROUND OF THE INVENTION

1. Field of the Invention

The invention relates to a device with an oscillator circuit comprising a current source; a capacitive node; a switching circuit coupling the current source and the capacitive node, the switching circuit having a control input for switching the switching circuit at least into a first or a second state, wherein the capacitive node is charged from the current source or discharged, respectively; a loop circuit coupling the capacitive node to the control input, the loop circuit being capable of causing operation of the oscillator circuit in at least a first and a second mode, the first mode being an oscillating mode having an oscillating period affected by charging of the capacitive node substantially during a critical time-interval only; and a mode breaker circuit for providing a conduction path which frustrates charging of the capacitive node in the second mode.

2. Description of the Related Art

Such a device is known from International Patent Application WO 94/26026. This publication describes a ring-oscillator containing eight inverters in a loop.

This ring-oscillator has several modes of operation. In an oscillating mode (called the first mode), two mutually opposite signal transitions travel around the loop. When a falling signal transition reaches the input of an inverter, its output voltage will start to rise. When the output voltage has sufficiently risen, this will trigger the next inverter to start discharging, and so on. The period of oscillation is the sum of the critical time-intervals between the start of charging or discharging and the triggering of the next inverter.

In a static mode of operation (an example of what will be called the second mode), the inverters of the ring-oscillator carry time-independent values, half of the inverters carrying a logic "high", the other half carrying a logic "low".

The publication uses what is called mode breaker circuits which destabilize the static mode to ensure that the loop will operate in the oscillating mode. The inverters in the ring-oscillator are functionally organized into pairs of inverters that are separated from each other by half the loop. In the oscillating mode, the inverters in a pair will have logically opposite output signals, but in the static mode, the inverters in a pair have identical output signals, both low or both high. A mode breaker circuit is coupled between the outputs of the inverters of each pair. The mode breaker circuits force the output signals of each pair of inverters to become different in case they are both high, making it impossible for the loop to stay in the static mode indefinitely.

According to WO94/26026, each inverter contains a current source and a capacitive output node. A switching circuit, controlled by the preceding inverter in the loop, determines whether the output node is charged by the current source or discharged. The mode breaker circuit forces the output node of a first inverter of a pair to discharge if the output node of a second inverter of the pair is charged. Thus, in the static mode, the two output nodes cannot both remain charged at the same time.

In the oscillating mode, the inverters of a pair is in phase opposition, so that the current source of the first inverter has to start charging its output node when the second inverter starts discharging its output node. Once the output node of the second inverter has sufficiently discharged, the mode breaker circuit will not inhibit charging of the output node of the first inverter. When the current source has sufficiently charged the output node of the first inverter, the first inverter will be able to trigger discharging in the next inverter in the loop, ensuring oscillation in the oscillating mode.

In such an oscillator circuit, the oscillation turns out to suffer from jitter, i.e., noise in the phase of the oscillation.

SUMMARY OF THE INVENTION

Among others, it is an object of the invention to provide an oscillator circuit as described above, in which the oscillation suffers less from jitter.

The oscillator circuit according to the invention is characterized in that the mode breaker circuit is arranged so that it blocks the conduction path during the entire critical time-interval when the oscillator circuit operates in the first mode. It has been found that the current source is an important factor in the prevention of jitter, because it suppresses effects of noise occurring in transistors in the switching circuit. This is known per se from U.S. Pat. No. 5,138,281 (PHN 13404). In the prior art WO94/26026, this suppression is lost because the mode breaker circuit steals current from the capacitive node during the critical time-interval in which the charging of the capacitive node affects the oscillating period in the first mode. Thus, the mode breaker circuit allows noise in the switching circuit to have an increased effect upon the oscillating frequency. According to the invention, this is prevented by ensuring that the mode breaker circuit cannot steal current from the capacitive node in the first (oscillating) mode anywhere during the time-interval in which the charging of the capacitive node affects the oscillating frequency.

This invention is not limited to simple ring-oscillators. For example, more complex oscillator arrangements, such as those described in U.S. Pat. No. 5,592,126 (PHN 14177), can be similarly improved.

An embodiment of the oscillator circuit according to the invention is characterized in that the mode breaker circuit has at least two inputs receiving respective oscillating signals from the loop circuit, the mode breaker circuit blocking said conduction path if said respective oscillating signals have a predetermined combined logic state which occurs at least during the entire critical time-interval. The loop contains, for example, a number of inverter stages in cascade, each with its own output signal. From a state transition diagram for the oscillating mode, it can readily be determined what combinations of logic values these output signals assume during the critical time-interval if the loop is in the first mode. Similarly, it can be determined what the logic values of these output signals are for a point in time at which discharging of the capacitive node would prevent the persistence of the second mode when the loop is in the second mode. The mode breaker circuit is designed in such a way that it is activated by a combination of output signals occurring at some such point in time in the second mode, but is deactivated by any combination of output signals occurring in the first mode during the charging time-interval. Thus, it is ensured that jitter is suppressed.

An embodiment of the oscillator circuit according to the invention is characterized in that the loop circuit comprises a cascade of identical stages, each comprising a respective capacitive node and switching circuit, the control input of each stage being coupled to the capacitive node of the preceding stage, an identical mode breaker circuit being provided for each stage. By using identically dimensioned mode breaker circuits at each stage in the loop, the phase values of the signals at the capacitive nodes are evenly spaced. This is convenient when the oscillator circuit is used as a clock oscillator in a circuit requiring a multiphase clock. For example, quadrature clock signals, having a phase spacing of 90 degrees, can be readily realized.

An embodiment of the oscillator circuit according to the invention is characterized in that the identical stages share the current source. The use of a common current source for all delay elements leads to an improved feedback effect that suppresses the effect of noise. This feedback effect involves reciprocal interaction between the oscillating frequency and the supply voltage. If any one delay element is affected by noise that causes it to draw more current and thereby to provide a shortened delay, a common capacitive node at the output of the current source is discharged, lowering the voltage at the common capacitive node. The lowered voltage, in turn, causes a smaller current to the capacitive nodes of the other delay elements when they start charging, and, therefore, a greater delay in those delay elements.

BRIEF DESCRIPTION OF THE DRAWINGS

These and other advantageous aspects of the oscillator circuit according to the invention will be further described using Figures, in which.

DESCRIPTION OF THE PREFERRED EMBODIMENTS

Figure 1:
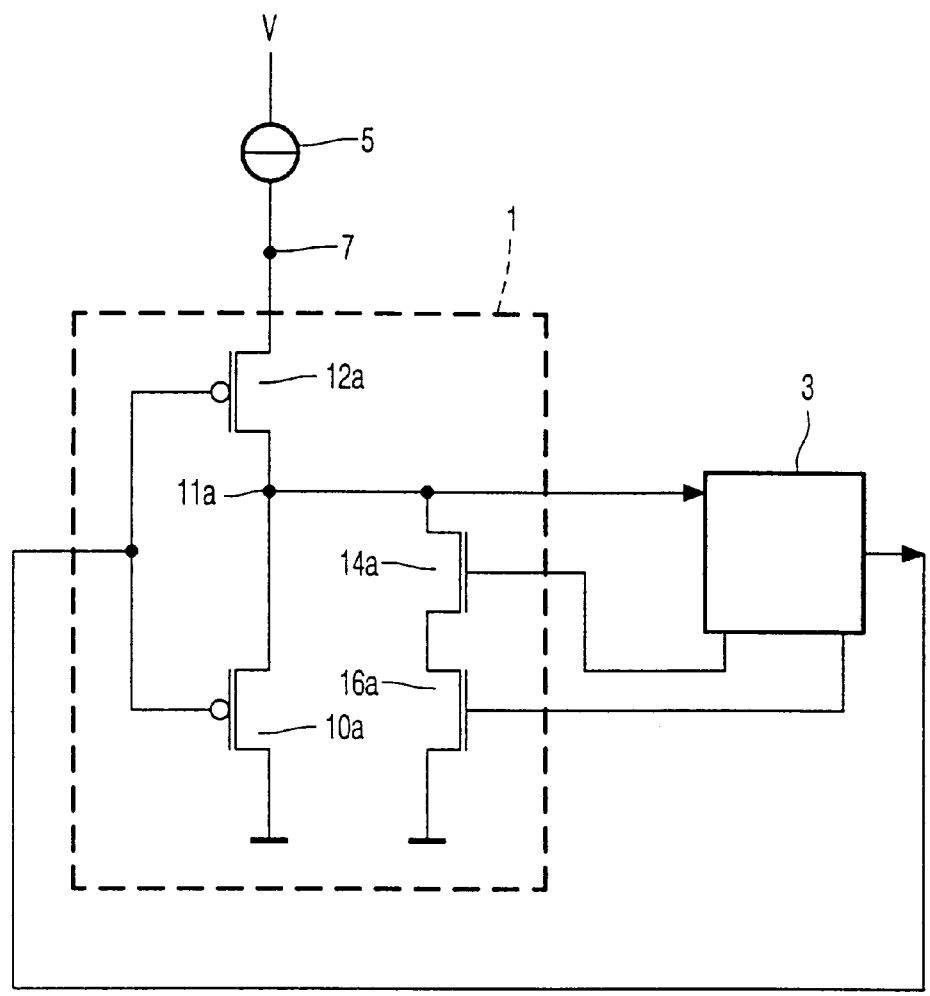
FIG. 1 shows an oscillator circuit according to the invention.

FIG. 1 shows an oscillator circuit according to the invention. The oscillator circuit contains an inverter stage 1, a loop circuit 3 and a current source 5. The loop circuit 3 couples an output node 11a of the inverter stage 1 back to an input of the inverter stage 1. The current source 5 is connected to a supply input 7 of the inverter stage 1 and, optionally, also to a supply input of the loop circuit 3.

The inverter stage 1 contains a series connection of the channels of a first NMOS transistor 10a, the output node 11a and a PMOS transistor 12a. A series connection of the channels of a second and third NMOS transistor 14a, 16a is connected in parallel to the channel of the NMOS transistor 10a. The channels of the first NMOS transistor 10a and the series connection of the second and third NMOS transistors 14a, 16a are connected to the output node 11a. The channel of the PMOS transistor 12a is connected between the supply node 7 and the output node 11a.

An output of the loop circuit 3 is coupled back to the input of the inverter stages formed by the gates of the first NMOS transistor 10a and the PMOS transistor 12a. Further outputs of the loop circuit 3 are coupled to the gates of the second and third NMOS transistors 14a, 16a, respectively.

In operation, the oscillator circuit oscillates. The inverter stage 1 passes voltage level transitions on its output to the loop circuit 3. The loop circuit 3 derives ensuing transitions from these transitions and passes the ensuing transitions back to the input of the inverter stage 1 with some delay. The received ensuing transitions cause the inverter to charge or discharge its output node 11a, which results in new transitions, and so on.

The current source 5 and the series connection of the second and third NMOS transistors 14a, 16a each have their own functions in the oscillator: stabilizing the oscillation frequency and suppressing spurious modes of circuit behavior, respectively, as will be explained in the following. An insight of the invention is that these functions may interfere with each other, in particular, the stabilization function may be hampered by the circuit for suppressing the spurious mode. The invention prevents this interference.

First of all, the stabilization function will be discussed. The use of a current source 5 as a supply for the inverter stage 1 makes it possible to obtain a very stable oscillation frequency, which would not otherwise be easily possible especially with an oscillator made up of CMOS transistors. A controllable current source 5 may also be used to adjust the frequency of the oscillation. Thus, the circuit may be used as a VCO in a phase-locked loop (PLL; not shown).

With proper stabilization, such an oscillator can even be made so stable that it can used satisfactorily as a pixel clock for processing of images by a video system. In this case, the oscillator signal is frequency divided and the frequency-divided signal is locked to the horizontal synchronization of an incoming video signal by adjusting the current of the current source 5 in the PLL. In such a video PLL, the current can be adjusted only once every line, i.e., once for many hundreds of oscillator periods (each period corresponding to a (sub-)pixel). To obtain acceptable images, the oscillator circuit should exhibit minimal instability between adjustments. This is achieved by using the current source 5 for controlling the oscillating frequency. The current source 5 provides a negative feedback against jitter in the oscillating signal in a frequency range above the PLL loop bandwidth.

This negative feedback works as follows. On average, the current supplied by the current source 5 is equal to the current consumed from the current source 5 by the inverter stage 1 and the loop circuit 3. The consumed current is used to charge the output node 11a and is proportional to the oscillation frequency, i.e., the number of times the output node 11a needs to be charged per unit time. The supply input 7 forms a capacitance with a voltage that settles at an average value that makes the PMOS transistor 12a conduct sufficient current to realize this frequency when the output node 11a is charged. When the frequency changes for some reason such as noise, a rising frequency, for example, will lead to a more frequent discharge of the capacitance of the supply input 7 and, therefore, to a drop in voltage at that supply input, and this, in turn, lowers the current through the PMOS transistor 12a and, therefore, also the speed with which the output node 11a is charged. This lowers the frequency, compensating the original frequency change.

Next, the suppression of spurious modes by the series connection of the second and third NMOS transistors 14a, 16a will be discussed. Without the second and third NMOS transistors 14a, 16a, the loop formed by the inverter stage 1 and the loop circuit 3 may operate in any one of several oscillation modes, e.g., one mode where two transitions travel through the loop at the same time, a second mode in which four transitions travel through the loop, or a third mode in which the loop has static voltage levels. The second and third transistors 14a, 16a are an example of a mode breaker circuit that may be used to suppress all but one of such modes. The further outputs of the loop circuit 3 and the circuit formed by the second and third NMOS transistors 14a, 16a are selected so that there is a discharge path from the output node 11a when the PMOS transistor also conducts when there is a signal configuration in the loop circuit 3 which occurs in the suppressed modes, but not in the unsupressed mode.

This type of mode breaker circuit may interfere with the stabilizing effect of the current source 5 if, during charging of the output node 11a, current leaks-off through the second and third NMOS transistors 14a, 16a. Noise in the leakage current leads to noise in the charging speed of the output node 11a and, thereby, in the frequency, and this noise is not compensated by the negative feedback provided by the current source 5. Compensation of other noise in the inverter stage is reduced because the leakage makes its effect appear smaller to the negative feedback mechanism which suppresses frequency jitter.

This interference can be prevented if it is ensured that the circuit which is added to suppress spurious modes does not conduct during the time-interval when the output node 11a is charged by the PMOS transistor 12a.

Figure 2:
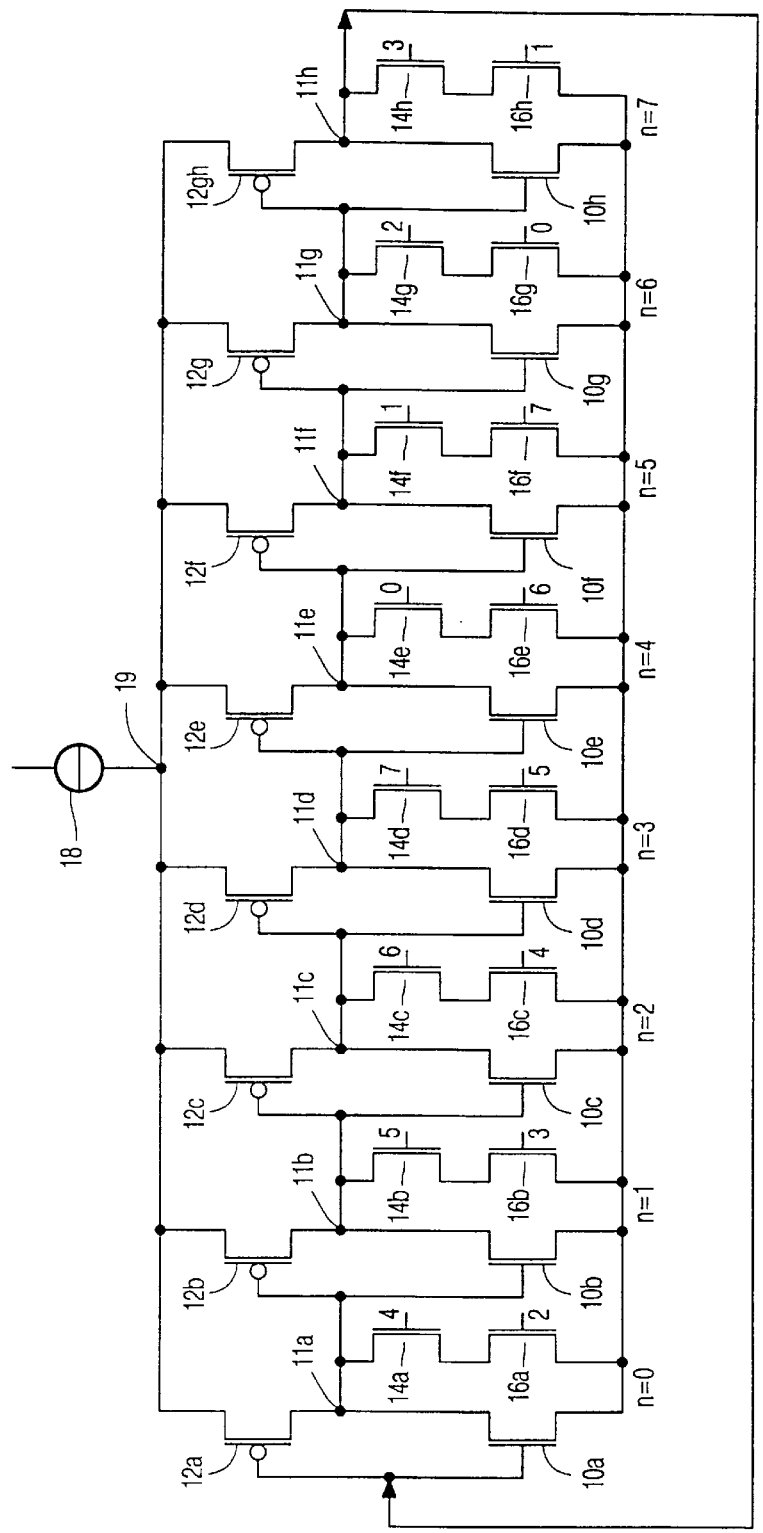
FIG. 2 shows an embodiment of an oscillator circuit according to the invention.

FIG. 2 shows an embodiment of the invention which illustrates an example of a loop circuit and selection of further outputs of that loop circuit to suppress a spurious mode. In this embodiment, the oscillator circuit contains a ring of eight inverter stages, each inverter stage containing a series connection of the channels of a first NMOS transistor 10a–h, an output node 11a–h and a PMOS transistor 12a–h. These series connections are connected in parallel between a common supply node 19 and ground. A current source 18 is connected to the common supply node 19. In each inverter stage, a series connection of the channels of a second and third NMOS transistor 14a–h, 16a–h is connected to the output node 11a–h, and in parallel to the channel of the NMOS transistor 10a–h.

Each inverter stage will be designated by a respective sequence number n=0 . . . 7 corresponding to the position in which it appears in the ring. A sequence number n outside the range 0 . . . 7 will be taken to refer to the inverter stage having the sequence number n mod 8 (the modulo function).

In an inverter stage having sequence number n, the control electrodes of the first NMOS transistor 10a–h and the PMOS transistor are connected to each other and to the output node 11a–h of the inverter stage having sequence number n−1. In the inverter stage n, the control electrode of the second NMOS transistor 14a–h is connected to the output node 11a–h of the inverter stage having the sequence number n+4, and the control electrode of the third NMOS transistor 16a–h is connected to the output node of the inverter stage with sequence number n+2.

Without the second and third NMOS transistors 14a–h, 16a–h, the oscillator circuit would latch into one of two stable states, i.e., in a first stable state, the voltage at the output node 11a–h of each of the inverter stages with even and odd sequence numbers would be logic "high" and "low", respectively, in a second stable state, the logic "high" and "low" levels would be the other way around. These stable states are destabilized by the presence of the series connections of the second and third NMOS transistors 14a–h, 16a–h. If the voltage at the output node 11a–h of an inverter stage with sequence number n is logic "high" in a stable state, then the voltages of the output nodes 11a–h of the inverter stages with sequence numbers n+2 and n+4 would also be logic "high" and, therefore, the series connections of the second and third NMOS transistors 14a–h, 16a–h in the inverter stage with sequence number n would conduct, destabilizing the stable state.

More generally, in a ring-oscillator with an even number □m□ of identical stages, the voltage V(t,n) at an output node 11a–h of an inverter stage with sequence number n will satisfy V(t,n)=f(t−npT/m) for even n, and V(t,n)=not(f(t−npT/m)) for odd n, where f(x) is a periodic function: f(t+iT)=f(t) (i an arbitrary integer), and T is the period of oscillation pT=mD (D being the delay time per inverter stage).

The integer "p" (4p<=m) is the mode number, and describes the number of signal transitions simultaneously traveling through the ring oscillator in a particular mode. The suppressed stable state described above has p=0. The series connections of the second and third NMOS transistors 14a–h, 16a–h suppress the modes with p=0 and p=2 in the oscillator circuit of FIG. 2. It has been found that the circuit of FIG. 1 does not oscillate in the p=2 mode; in this mode, the transitions traveling through the ring-oscillator catch up with each other and annihilate each other.

Figure 3:
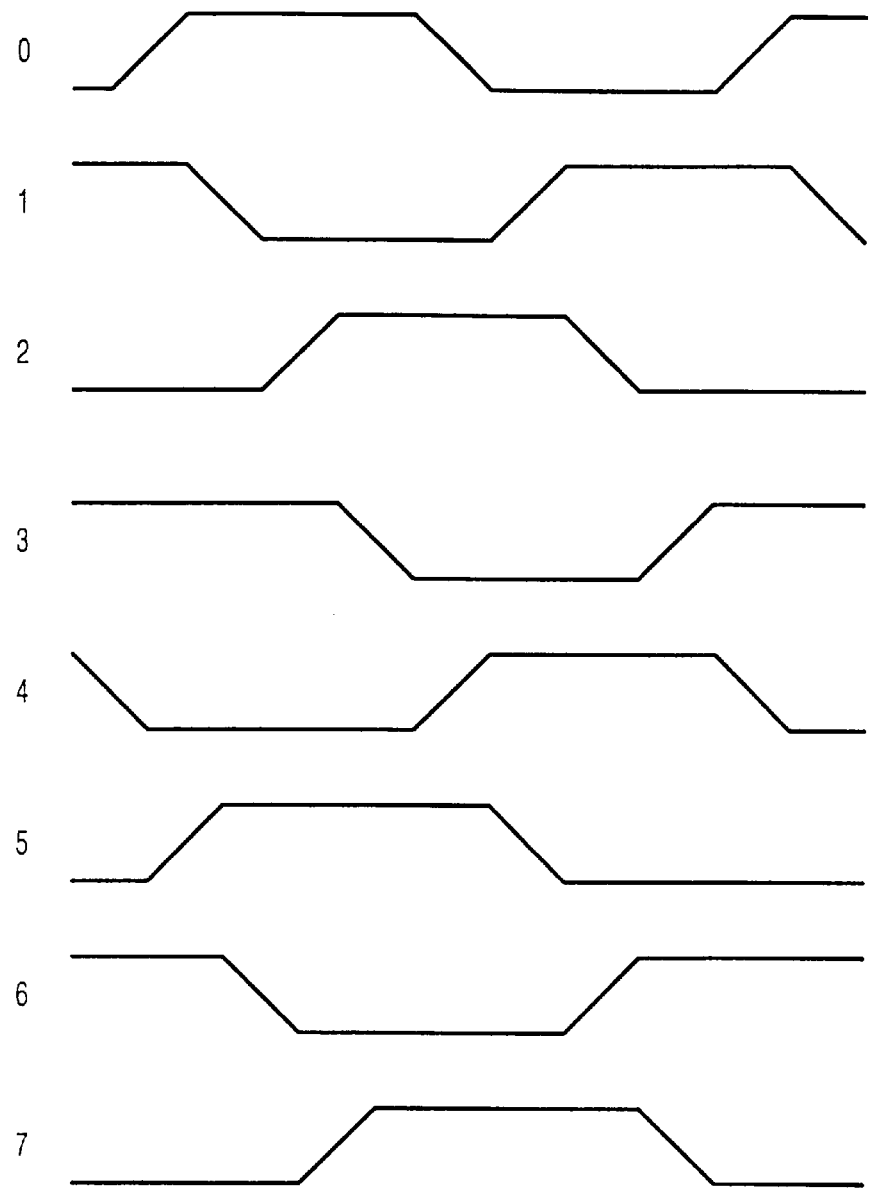
FIG. 3 shows diagrams of voltages at the output nodes of the oscillator circuit.

FIG. 3 shows diagrams of voltages at the output nodes 11a–h during operation of the oscillator circuit of FIG. 1 in the p=1 mode. The voltages at the output nodes 11a–h are seen to oscillate between a logic "high" level and a logic "low" level. There is a phase shift between the voltages of the output nodes 11a–h: the phase shift between the voltages at the output nodes 11a–h of inverter stages with both even or both odd sequence numbers n and m, respectively, is ((n−m) mod 8)/8 of a full period, the phase shift between the voltages at the output nodes 11a–h of the inverter stages with even and odd sequence numbers n, m, respectively, is ((n−m) mod 8)/8 of a full period plus half a period.

The current with which the output nodes 11a–h are charged derives from the current source 18. The current source 18 permanently charges the common supply node 19. The inverter stages discharge the common supply node 19 when they charge their own output nodes 11a–h. In a steady oscillating state, the sum of the discharge currents is the same, on average, as the current supplied by the current source 18 and there is zero net average current to the common supply node 18.

The use of a common supply node 19 has a regulating effect on the oscillating frequency because of an interaction between the voltage at the common supply node 18 and the oscillation frequency. An increased voltage at the common supply node 18 leads to an increased charging current to the output nodes 11a–h, and, therefore, to a smaller inverter stage delay D. The smaller delay, in turn, leads to an increased oscillation frequency. On the other hand, an increased oscillation frequency leads to an increased discharge current from the common supply node and, therefore, to a lower voltage at the common supply node, because a discharge current is drawn by an inverter stage when it charges it output node 11a–h, and an increased oscillation frequency means that the inverter stage charges its output node 11a–h more often per unit time.

This creates a feedback effect which compensates fluctuations in the currents charging the output nodes 11a–h. To have a maximum feedback effect, it is important that the current drawn from the common supply node 19 is used as much as possible for charging only the output nodes 11a–h. In this respect, any short-circuit current drawn in an inverter stage by the series connection of the second and third NMOS transistors 14a–h, 16a–h when the PMOS transistor 12a–h of the inverter stage is conductive would detract from for the feedback effect.

It will now be shown that the circuit of FIG. 2 prevents such short circuit currents. and that, therefore, the feedback effect is improved. The voltage at the output node 11a–h of the inverter stage with sequence number n is in phase opposition with the voltage at the output node 11a–h of the inverter stage with sequence number n+4. Hence, when the voltage at the output node 11a–h of the inverter stage with sequence number n+4 is at a logic "high" level, making the second NMOS transistor 14a–h conduct, the voltage at the output node 11a–h of the inverter stage with sequence number n is at a logic "low" level. This means that the series connection of the second and third NMOS transistors 14a–h, 16a–h does not affect operation of the oscillator circuit when the voltage at the output node 11a–h of the inverter stage with sequence number n+4 is at the high logic level.

However, the second NMOS transistor 14a–h will also conduct for brief time-intervals when the voltage of the output node 11a–h of the inverter stage with sequence number n+4 approaches the logic "high" level or starts to leave that level. At the same time, during these time-intervals "before and after" the logic "high" level, the voltage of the node 11a–h of the inverter stage with sequence number n is pulled down and up, respectively. This means that in the □after□ time-interval, which occurs when the output node of the inverter stage with sequence number n+4 starts to leave the logic "high" level, the second NMOS transistor 14a–h of the inverter stage with sequence number n will be conductive at the same time when also the PMOS transistor 12a–h of that inverter stage with sequence number n is conductive.

The third NMOS transistor 16a–h ensures that there will be no short circuit current in this case. The output node 11a–h of the inverter stage with sequence number n+2 is at a low logic level when the PMOS transistor 12a–h of the inverter stage with sequence number n starts pulling up the voltage of the output node 11a–h. The third NMOS transistor 16a–h of the inverter stage with sequence number n will therefore be non-conductive and no short circuit current will flow through the series connection of the second and third NMOS transistor 14a–h, 16a–h.

In an alternative way to stabilize the frequency, each inverter stage may be equipped with its own current source (not shown) instead of the common current source 18, to charge its output node 11a–h. In this case, the current source ensures a constant charging speed in the time interval when the inverter stage switches between logic "low" and logic "high", which is the critical time interval for the determination of the oscillating frequency. The series connection of the second and third NMOS transistors 14a–h, 16a–h prevents that current from the current source is short-circuited from the output node during this critical time-interval, detracting from the stability of the frequency.

Thus, the series connection of the second and third NMOS transistors 14a–h, 16a–h has the function of preventing short circuits that detract from frequency stability. In addition, this series connection can also function to replace the discharging function of the first NMOS transistor 10a–h to a greater or lesser extent. This is illustrated in FIGS. 4 and 5.

Figure 4:
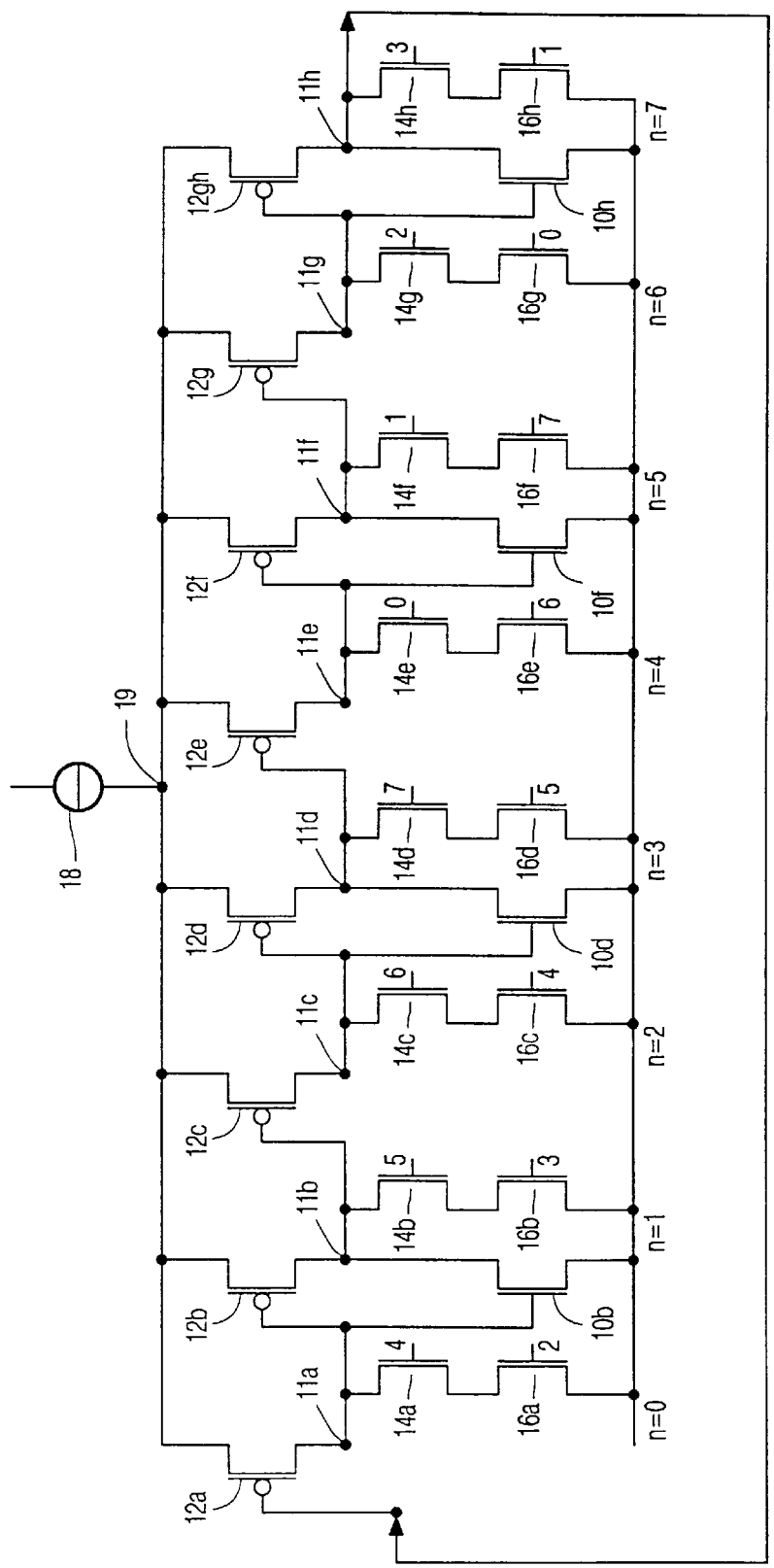
FIG. 4 shows another embodiment of an oscillator circuit according to the invention.
Figure 5:
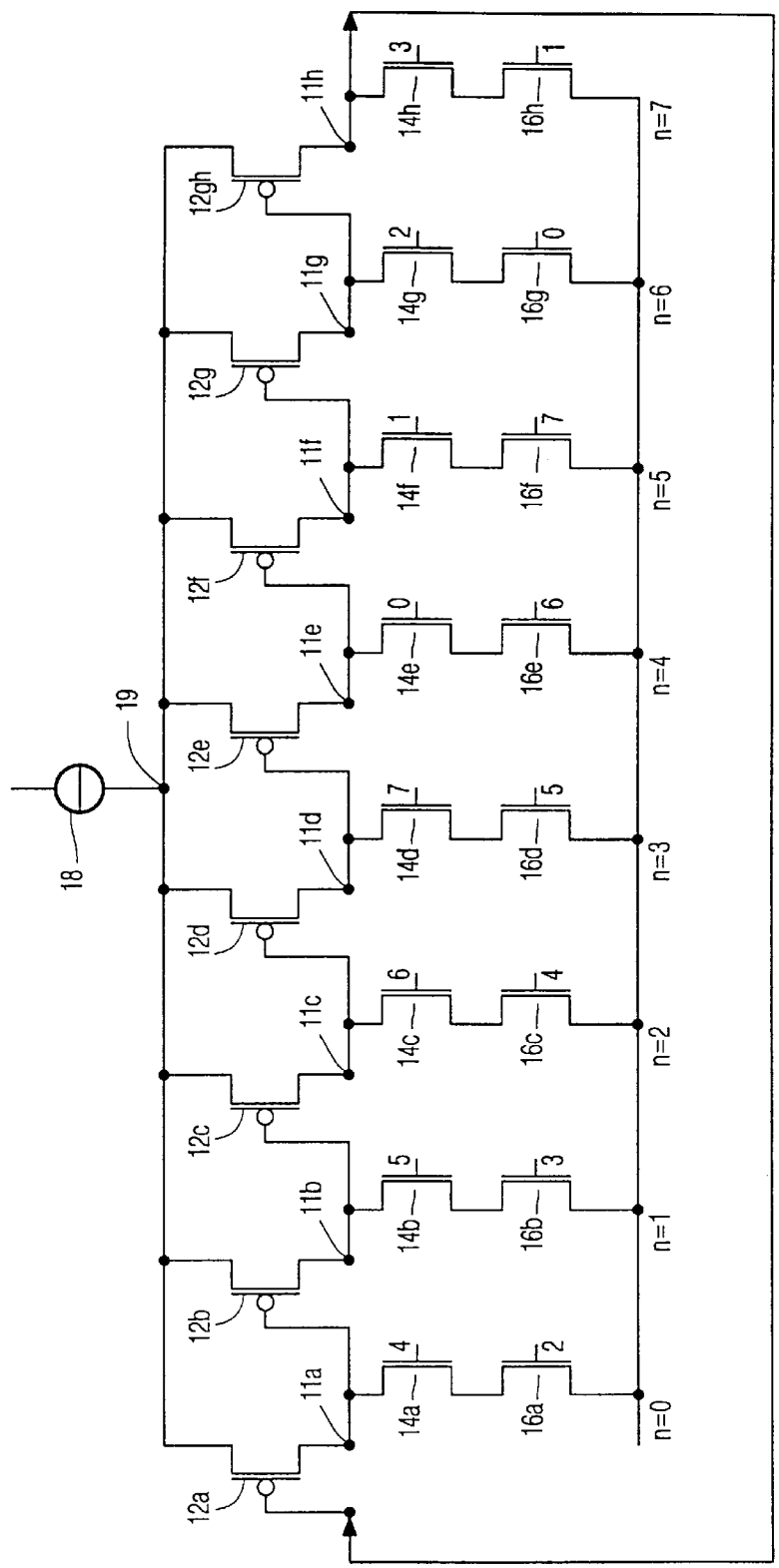
FIG. 5 shows another embodiment of an oscillator circuit according to the invention.

FIG. 4 shows an oscillator circuit in which the first NMOS transistors 10a–h have been omitted altogether in the inverter stages with even sequence number. In operation, the discharging of the output nodes 11a–h of the inverter stages with even sequence number is taken over by the series connection of the second and third NMOS transistors 14a–h, 16a–h. This changes the duty cycle of the oscillation waveforms, because discharging is postponed until both transistors 14a–h, 16a–h in the series connection conduct.

This results in a slightly different oscillating mode as compared with the oscillator circuit of FIG. 1. The oscillator circuit of FIG. 1 alternately assumes only one type of transition state Qn in which the inverter stages having sequence numbers n and n+4 are making an upward and downward transition, respectively, and the other inverter stage are at a logic "high" or "low" level. E.g., for n=0 in the first transition state Q0, the voltages of the output nodes 11a–h of successive inverter stages have the state UHLH-DLHL (L="low" level, H="high" level, U=going up, D=going down), Q1=LUHLHDLH, and so on, by cyclic permutation. The oscillator circuit cycles through a succession of the transition states Q0 Q5 Q2 Q7 Q4 Q1 Q6 Q3 Q0, and so on (from transition state Qn to transition state Qn+5). Thus, the oscillator circuit cycles through eight different transition states in an oscillating period, and the output nodes 11a–h carry eight phase-shifted versions of one signal, which is alternately "high" for three transition states and "low" for three transition states. The phase-shifted versions can be grouped in pairs that are the logically complementary to one another.

The oscillator circuit of FIG. 4 will alternately assume one of two types of transition states: a first type of transition state Sn in which the voltages of the output node 11a–h of two inverter stages n and n+3 are both making a downward transition, and a second type of transition state Pn in which the voltages at the output nodes 11a–h of two inverter stages n and n+3 are both making an upward transition. In an example of the first type of transition state S0 (n=0), the voltages of the output nodes 11a–h of successive inverter stages have the states DLHDLHLH. In an example of the second type of transition state P0 (n=0), the voltages have the states UHLUHLHL. Other states S1 . . . and P1 . . . are defined by cyclic permutation of S0 and S1: S1=LHDLHLHD, and so on.

The oscillator circuit cycles through the transition states S0 P1 S2 P3 S4 P5 S6 P7 S0, and so on (from transition state Sn to Pn+1 and from transition state Pn to Sn+1). Therefore, this oscillator circuit cycles through eight different transition states in an oscillating period and the output nodes 11a–h carry four phase-shifted versions of a first signal and four phase-shifted versions of a second signal. The first signal is logic "high" for three states and logic "low" for four states in a period. The second signal is the inverse of the first signal and pairs of phase-shifted versions of the two signals are logically complementary to one another.

Instead of omitting the first NMOS transistors 10a–h, they may also be replaced by weaker transistors. As a result, the duty cycle will be affected to a lesser extent.

FIG. 5 shows an oscillator circuit in which the first NMOS transistors 10a–h have been omitted in all of the inverter stages. In operation, this oscillator circuit will cycle through two types of transition states: a first type Rn in which the voltage at the output node 11a–h of the inverter stage with sequence number n is making an upward transition, and a second type Tn in which the voltage at the output node 11a–h of the inverter stage with sequence number n is making an downward transition. In an example of the first type of transition state R0 (n=0), the state of the output nodes 11a–h of successive inverter stages is UHLHHLHL. In an example of the second type of state T0 (n=0), the states are DLHLHHLH. The oscillator circuit cycles through the transition states R0 T4 R5 T1 R2 T6 R7 T3 R4 T0 R1 T5 R6 T2 R3 T7 R0, and so on (from transition state Rn to transition state Tn+4 and from transition state Tn to transition state Rn+1). Therefore, this oscillator circuit cycles through sixteen different transition states in each oscillating period and the output nodes 11a–h carry eight phase-shifted versions of one signal, which is "high" for eight states and "low" for six states in a period. The eight phase-shifted versions are independent, i.e., they cannot be paired in logically complementary pairs.

Of course, the invention is not limited to oscillator circuits made up of eight inverter stages. It applies to ring-oscillators with any number of stages and to more complicated oscillator arrangements. Any ring-oscillator with an even number of stages will need a mode-breaker circuit to prevent it from latching into a static state. Also, ring-oscillators with an odd number (9 or more) of stages are capable of oscillating in several modes, in which more than one level transition travels through the ring simultaneously (the number of traveling transitions will be odd and in any case smaller than N/2, N being the number of oscillators). Such oscillators, therefore, also may use mode-breaker circuits which need to be prevented from creating short-circuit currents that compromise frequency stability.

What is claimed is:

1. A device with an oscillator circuit comprising:
    a current source;
    a capacitive node;
    a switching circuit coupling the current source and the capacitive node, the switching circuit having a control input for switching the switching circuit at least into a first or a second state, wherein the capacitive node is charged from the current source or discharged, respectively;
    a loop circuit coupling the capacitive node to the control input of the switching circuit, the loop circuit causing operation of the oscillator circuit in at least a first and a second mode, the first mode being an oscillating mode having an oscillating period affected by charging of the capacitive node substantially during a critical time-interval only; and
    a mode breaker circuit for providing a conduction path which frustrates charging of the capacitive node in the second mode;
characterized in that the mode breaker circuit blocks the conduction path during the entire critical time-interval when the oscillator circuit operates in the first mode.

2. A device according to claim 1, wherein the mode breaker circuit has at least two inputs for receiving respective oscillating signals from the loop circuit, the mode breaker circuit blocking said conduction path if said respective oscillating signals have a predetermined combined logic state which occurs at least during the entire critical time-interval.

3. A device according to claim 1, wherein the loop circuit comprises a cascade of identical stages, each comprising a respective capacitive node and switching circuit, the control input of the switching circuit of each stage being coupled to the capacitive node of the preceding stage, an identical mode breaker circuit being provided for each stage.

4. A device according to claim 3, wherein the identical stages share the current source.

5. A device according to claim 1, wherein the loop circuit comprises a cascade of stages, each stage comprising an inverter with a pull-up transistor having a main current channel coupled between the current source and the capacitive node of the stage, a control electrode of the pull-up transistor being coupled to the capacitive node of a preceding stage in the cascade, the mode breaker circuit comprising, for each stage, a pull-down circuit with a discharge channel coupled between the capacitive node of that stage and a discharge node, and at least two control electrodes coupled to respective capacitive nodes of other stages in the cascade, whereby the pull-down circuit does not conduct in the critical time-interval when the main current channel of the pull-up transistor is conductive, and the pull-down circuit conducts at a time when the pull-up transistor conducts in the second mode.

6. A device according to claim 5, wherein at least some of the stages comprise a pull-down transistor having a main current channel coupled between the capacitive node and the discharge node, a control electrode of the pull-up transistor being coupled to the capacitive node of a preceding stage in the cascade.

7. A device according to claim 5, wherein the stages share the current source.

8. A device according to claim 3, wherein each stage comprises an inverter having:
    a pull-up transistor having a main current channel coupled between the current source and the capacitive node of the stage, a control electrode of the pull-up transistor being coupled to the capacitive node of a preceding stage in the cascade; and
    a pull-down transistor having a main current channel coupled between the capacitive node and the discharge node, a control electrode of the pull-up transistor being coupled to the capacitive node of a preceding stage in the cascade, the mode breaker circuit comprising, for at least some of the stages, a pull-down circuit with a discharge channel coupled between the capacitive node of the stage and the discharge node, and at least two control electrodes coupled to capacitive nodes of stages in the cascade, whereby the pull-down circuit does not conduct in the critical time-interval when the main current channel of the pull-up transistor is conductive, and the pull-down circuit conducts at a time when the pull-up transistor conducts in the second mode.

9. A device according to claim 8, wherein the stages share the current source.

10. A device according to claim 1, wherein the device further comprises an image processing circuit, the oscillator circuit being coupled to the image processing circuit for supplying a pixel clock, the device comprising a PLL for regulating a current through the current source for locking oscillation of the oscillator circuit to a horizontal sync signal.

* * * * *